US006265316B1

United States Patent
Yoshida

(10) Patent No.: US 6,265,316 B1
(45) Date of Patent: Jul. 24, 2001

(54) ETCHING METHOD

(75) Inventor: Kazuyoshi Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/166,426

(22) Filed: Oct. 5, 1998

(30) Foreign Application Priority Data

Apr. 3, 1998 (JP) .................................... 10-092115

(51) Int. Cl.$^7$ ................................. H01L 21/311
(52) U.S. Cl. .................... 438/700; 438/700; 438/9; 438/14; 438/714
(58) Field of Search .................... 438/9, 16, 714, 438/700, 701

(56) References Cited

U.S. PATENT DOCUMENTS

| 4,994,409 | * | 2/1991 | Yoon et al. ............................ 437/164 |
| 5,686,345 | * | 11/1997 | Harmon et al. ....................... 437/67 |
| 5,759,424 | * | 6/1998 | Imatake et al. ....................... 216/60 |
| 5,807,789 | * | 9/1998 | Chen et al. ............................ 438/714 |
| 5,843,226 | * | 12/1998 | Zhao et al. ............................ 117/97 |
| 5,877,032 | * | 3/1999 | Guinn et al. ........................... 438/9 |
| 5,891,807 | * | 4/1999 | Muller et al. .......................... 438/713 |
| 6,127,278 | * | 3/1999 | Wang et al. ........................... 438/719 |

FOREIGN PATENT DOCUMENTS

| 57-60851 | 4/1982 | (JP) . |
| 63-76435 | 4/1988 | (JP) . |
| 1-183124 | 7/1989 | (JP) . |
| 1-278728 | 11/1989 | (JP) . |
| 6-163478 | 6/1994 | (JP) . |
| 7-122543 | 5/1995 | (JP) . |
| 7-245291 | 9/1995 | (JP) . |
| 8-316200 | 11/1996 | (JP) . |
| 8298257 | 11/1996 | (JP) . |
| 9186134 | 7/1997 | (JP) . |
| WO 99/30359 | * 6/1999 | (WO) .................... H01L/21/3065 |

* cited by examiner

Primary Examiner—Matthew Smith
Assistant Examiner—Renzo N. Rocchegiani
(74) Attorney, Agent, or Firm—Young & Thompson

(57) ABSTRACT

A method of forming a trench in a semiconductor substrate by gas plasma etching having the steps of detecting and analyzing emission spectrums of gas plasma etching products and controlling the gas plasma etching based on the ratio of the emission spectrums. The etching uses a $HBr/O_2$ gas. The ratio of emission spectrums is preferable from 1 to 2.

39 Claims, 12 Drawing Sheets

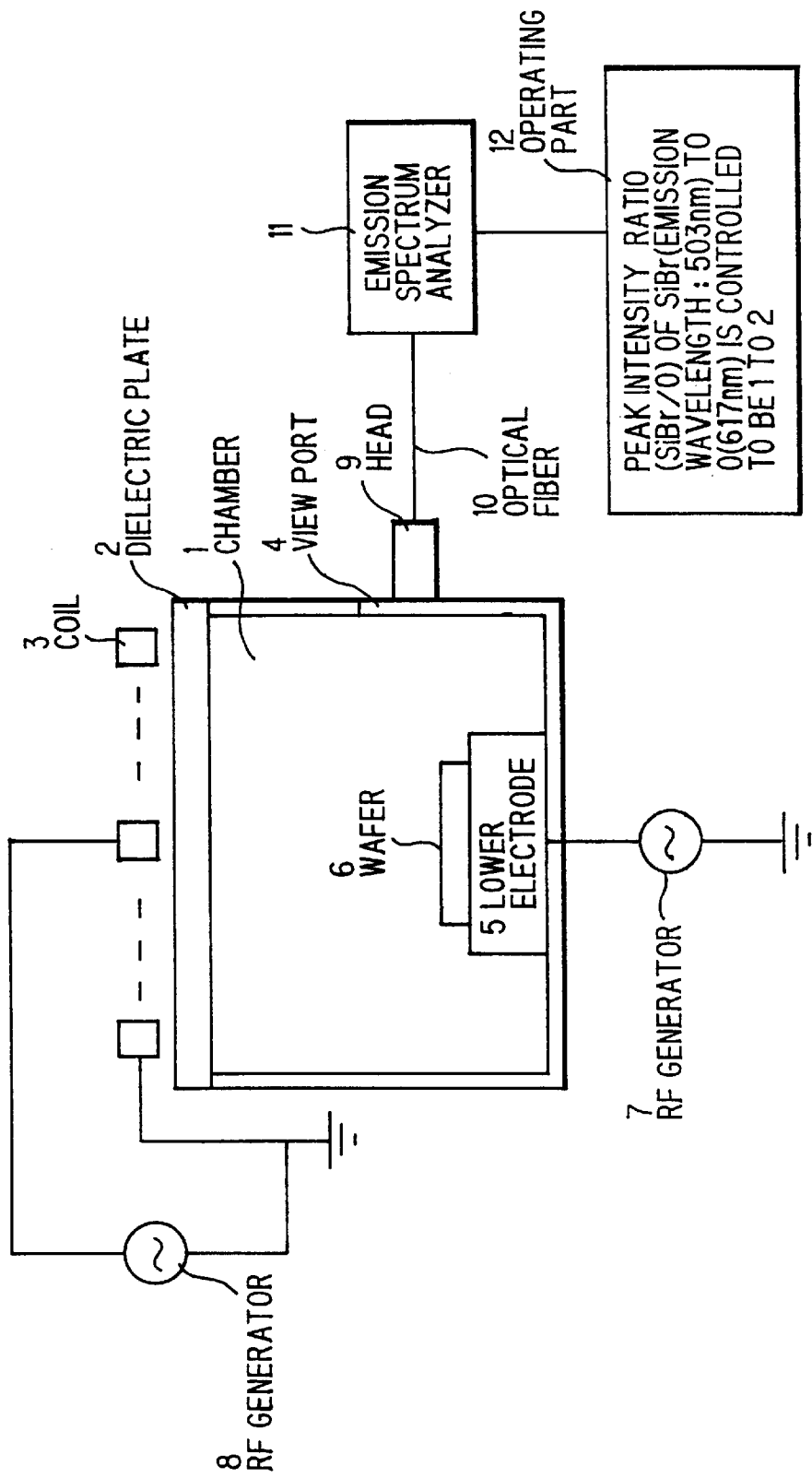

BEFORE SILICON-TRENCH-ETCHING

AFTER SILICON-TRENCH-ETCHING

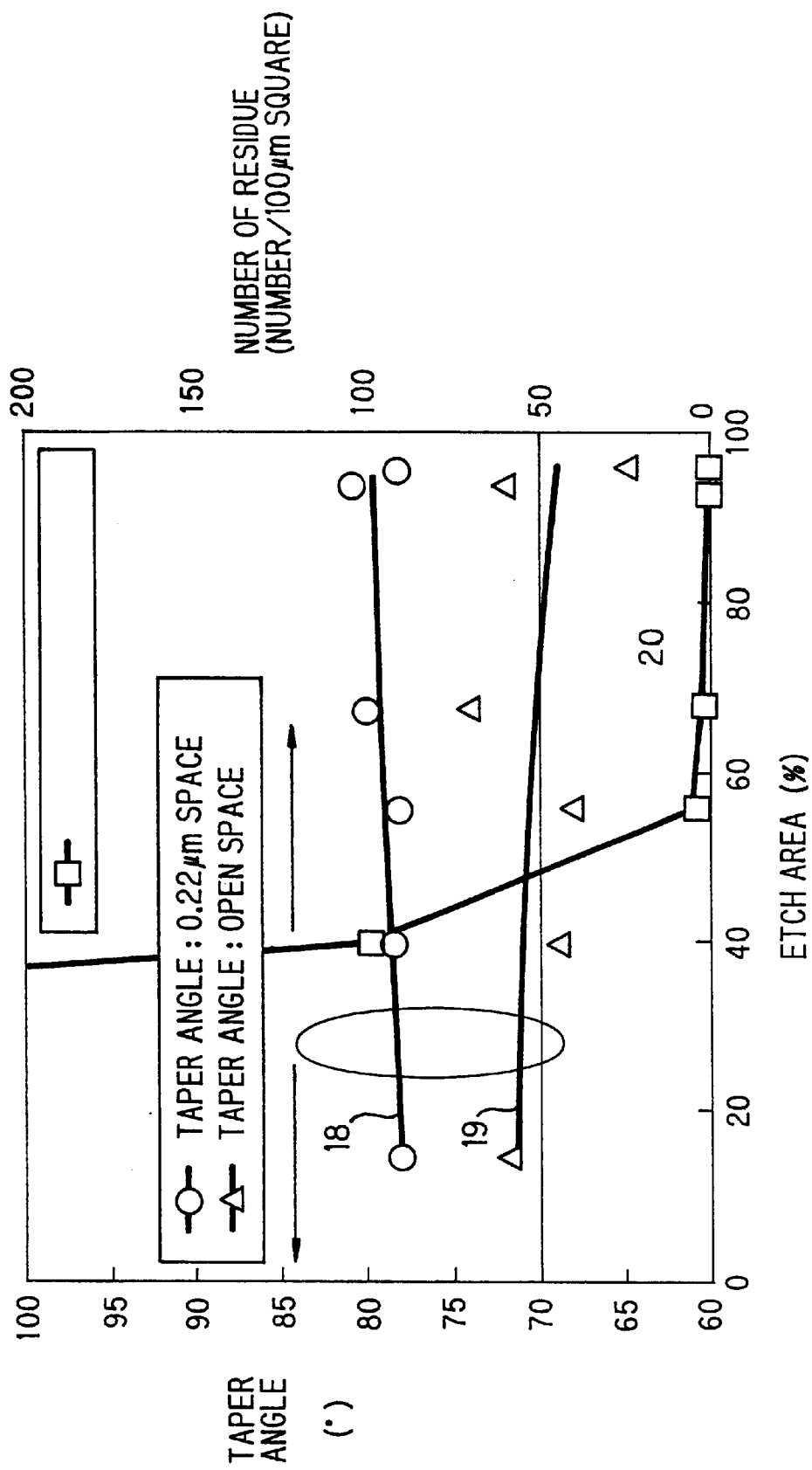

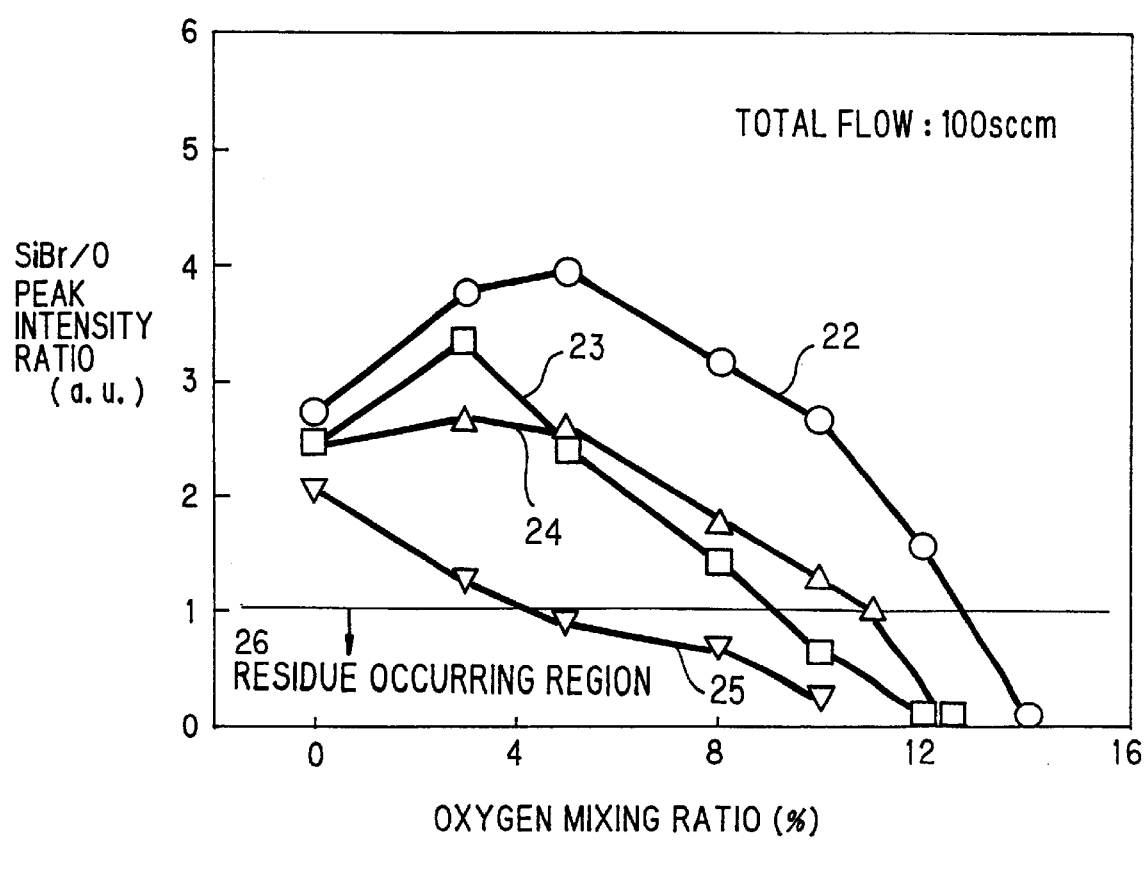

OPEN SPACE

SPACE WIDTH = 0.22μm

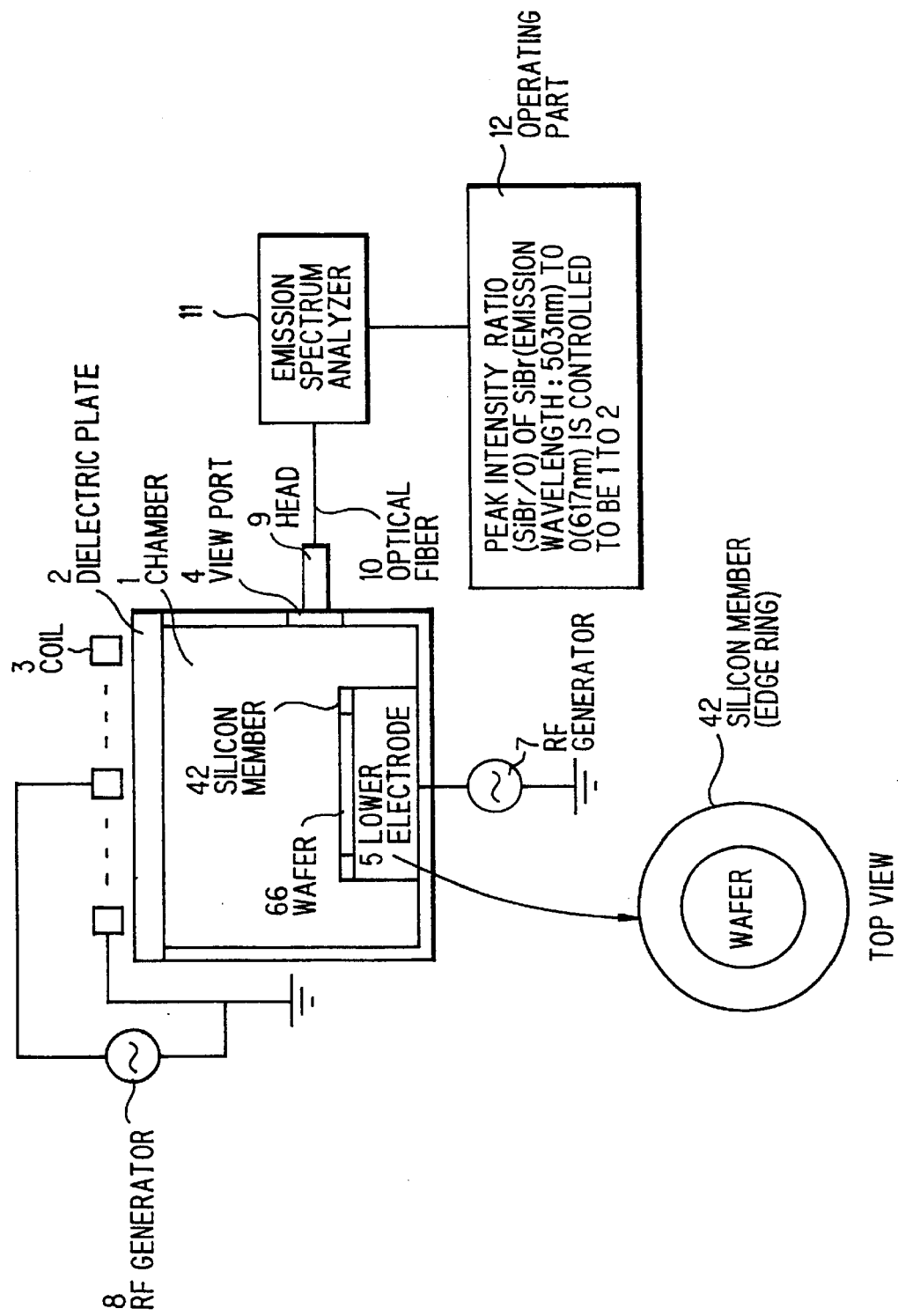

BEFORE SILICON-TRENCH-ETCHING

AFTER SILICON-TRENCH-ETCHING

ETCHING METHOD

FIELD OF THE INVENTION

This invention relates to an etching method for forming a trench on a semiconductor substrate by gas plasma etching, and more particularly to, a device-separating trench etching method.

BACKGROUND OF THE INVENTION

In a conventional etching technique using gas plasma, observing the state of a sample to be etched by some way is known. As the conventional etching technique, for example, Japanese patent application laid-open No.1-183124 (1989) discloses an etching method that, in a process of forming a trench in a treated material, prior to conducting the plasma etching, an oxide film for detecting the end point of etching on the treated material is formed and then a polysilicon film equal to the depth of trench is formed thereon, thereafter removing the oxide film and polysilicon film to open the trench. A product by the reaction of the oxide film and ion gas plasma is detected by emission spectrum analysis in the process of conducting the plasma etching.

Also, Japanese patent application laid-open No.1-278728 (1989) discloses an etching method that, in forming a trench in a treated material, prior to conducting the plasma etching, predetermined ions are ion-implanted up to a position equal to the depth of the trench to be measured from the upper surface at a position to form the trench in the treated material, and a product formed by the ions is detected by emission spectrum analysis or mass spectrum analysis in the process of conducting the plasma etching.

When plasma etching, further to the detection of the end point of etching being solved by Japanese patent application laid-open Nos.1-183124 (1989) and 1-278728 (1989), "a method for conducting the etching" that does not generate any etch residue or etch stop is also important.

Also, it is desired that the taper angle of a trench to be formed by etching be constant regardless of the etch area.

Further, a problem in the plasma etching is that it can easily performed according to a variation in the ratio (i.e., a specification required to etching) of etch area to an etched sample.

Also, the above problems need to be solved, with succeeding the conventional plasma etching technique, i.e., by means to be within the range of conventional facilities.

However, means to solve the above problems need to have such a property that can be performed even by introducing additionally a larger-scale automatic control unit as the case may be, i.e., expandability to be prepared to the prospects for the future.

SUMMARY OF THE INVENTION

Accordingly, it is an object of the invention to provide an etching method that does not generate any etch residue or etch stop.

According to the invention, a method of forming a trench in a semiconductor substrate by gas plasma etching, comprises the steps of:

conducting a predetermined pre-treatment for etching to the semiconductor substrate;

conducting the gas plasma etching under an etching condition with a predetermined initial setting;

detecting and analyzing an emission spectrum occurred with the gas plasma etching;

monitoring the analyzing result; and controlling the gas plasma etching on the basis of the monitored result of the analyzing result of the emission spectrum in the process of conducting the etching, wherein the controlling step of the gas plasma etching includes a renewal of etching condition.

BRIEF DESCRIPTION OF THE DRAWINGS

The invention will be explained in more detail in conjunction with the appended drawings, wherein:

FIG. 1 is an illustration showing the composition of an etching system used for an etching method in a first preferred embodiment according to the invention, FIG. 3 is a graph obtained summarizing the experimental results data in searching the correlation among SiBr/O peak intensity ratio, etch residue and taper angle, FIG. 5 is a graph obtained summarizing the experimental results data in searching the oxygen mixing ratio dependency of SiBr/O peak intensity ratio, FIG. 11 is an illustration showing the composition of an etching system used for the etching method in a third preferred embodiment according to the present invention.

DESCRIPTION OF THE PREFERRED EMBODIMENTS

Figure 2A:
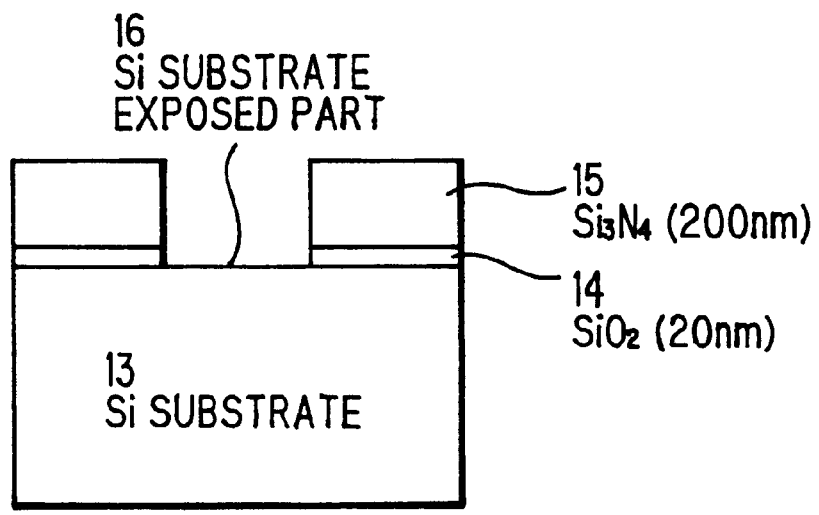
FIGS. 2A and 2B are cross sectional views showing an etching sample to be sequentially processed by the etching method in the first embodiment according to the present invention.

The preferred embodiments of the present invention will be explained below referring to the drawings.

First Embodiment

First, an etching method in the first embodiment according to the present invention will be explained.

FIG. 1 is an illustration showing the composition of an etching system used for the etching method in the first embodiment according to the present invention. The etching system shown in FIG. 1 takes the composition that an emission spectrum analyzing unit is connected with an inductively-coupled plasma etching system to produce low-pressure and high-density plasma The composition of the etching system will be explained below, referring to FIG. 1.

A dielectric plate 2 is disposed at the top of a chamber 1, a lower electrode 5 is disposed at the bottom and inside of the chamber 1, and a wafer 6 to be etched is put on the lower electrode 5. A coil 3 is disposed, surrounding the chamber 1, at a corresponded position over the dielectric plate 2, and an alternating voltage from an RF generator 8 is applied to the coil 3. An alternating voltage by a RF generator 7 is applied to the lower electrode 6.

Also, a view port 4 of quartz is disposed on the sidewall of the chamber 1. Rays of light in the chamber 1 are detected through the view port 4 by a head 9 and sent out through an optical fiber 10 to an emission spectrum analyzer 11. The analysis result of the emission spectrum analyzer 11 is monitored by an operating part 12 to control the etching, and it is used to control the whole etching work including a variation in etching conditions.

Meanwhile, the work to be operated by the operating part 12 is conducted by its operator. However, in some cases, it may be conducted by an automatic control system.

Figure 2B:
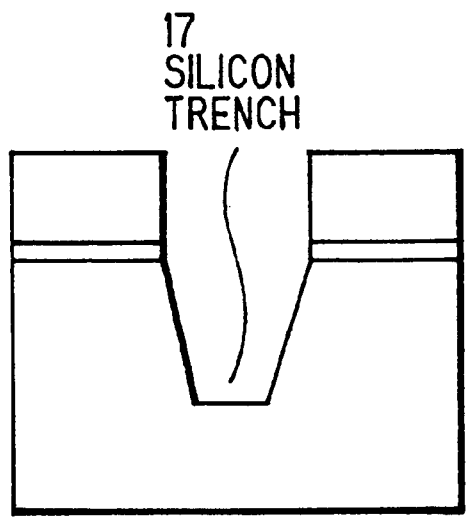

FIGS. 2A and 2B are cross sectional views showing an etched sample to be sequentially processed by the etching method in the first embodiment according to the present invention.

Referring to FIG. 1 and FIGS. 2A and 2B, the steps of the etching method in the first embodiment according to the present invention will be explained below.

As shown in FIG. 2A, an oxide film ($SiO_2$) 14 of about 20 nm thick is first formed on a single-crystal silicon substrate 13, and a silicon nitride film ($Si_3N_4$) 15 of about 200 nm thick is formed thereon. Then, patterning is conducted by the photolithography process and the silicon nitride film 15 and the oxide film 14 are dry etched where a silicon trench will be formed.

Thereafter, where the silicon trench will be formed, the photoresist film is removed and the silicon nitride film 14 is removed, thereby exposing a Si substrate exposed part 16.

Then, by using the above-mentioned "inductively-coupled plasma etching system to produce low-pressure and high-density plasma" in FIG. 1, the silicon-trench etching is conducted to form a silicon trench 17.

For this silicon-trench etching, $HBr/O_2$ system gas is used. In conducting this etching, as shown in FIG. 1, an emission spectrum, which is detected through the view port 4 disposed at the side wall of the chamber 1 by the head 9, is monitored. In particular, for example, the peak intensity ratio (hereinafter referred to as "SiBr/O") of an etch product SiBr with an emission wavelength of 504 nm and oxygen with an emission wavelength of 617 nm is monitored. The SiBr/O peak intensity ratio is controlled to be 1 to 2 by varying the etching conditions etc. By controlling the SiBr/O peak intensity ratio to be 1 to 2, a sample shape with a taper angle of 80° at a separation width of 0.24 μm can be obtained, without the etch residue.

FIG. 3 is a graph obtained summarizing the experimental results data in searching the correlation among SiBr/O peak intensity ratio, etch residue and taper angle.

The correlation among SiBr/O peak intensity ratio, etch residue and taper angle will be explained below, referring to the experimental data in FIG. 3.

In the above experiment, the etch residue increases with a decrease in etch area. On the other hand, the taper angle is almost constant, not depending on the etch area. However, all the etchings are conducted under same conditions below.
(Etching Conditions)
    gas; $HBr/O_2$=90/10 sccm
    pressure; 5 mTorr
    source power; 600 W
    bias power; 150 W.

Figure 4:
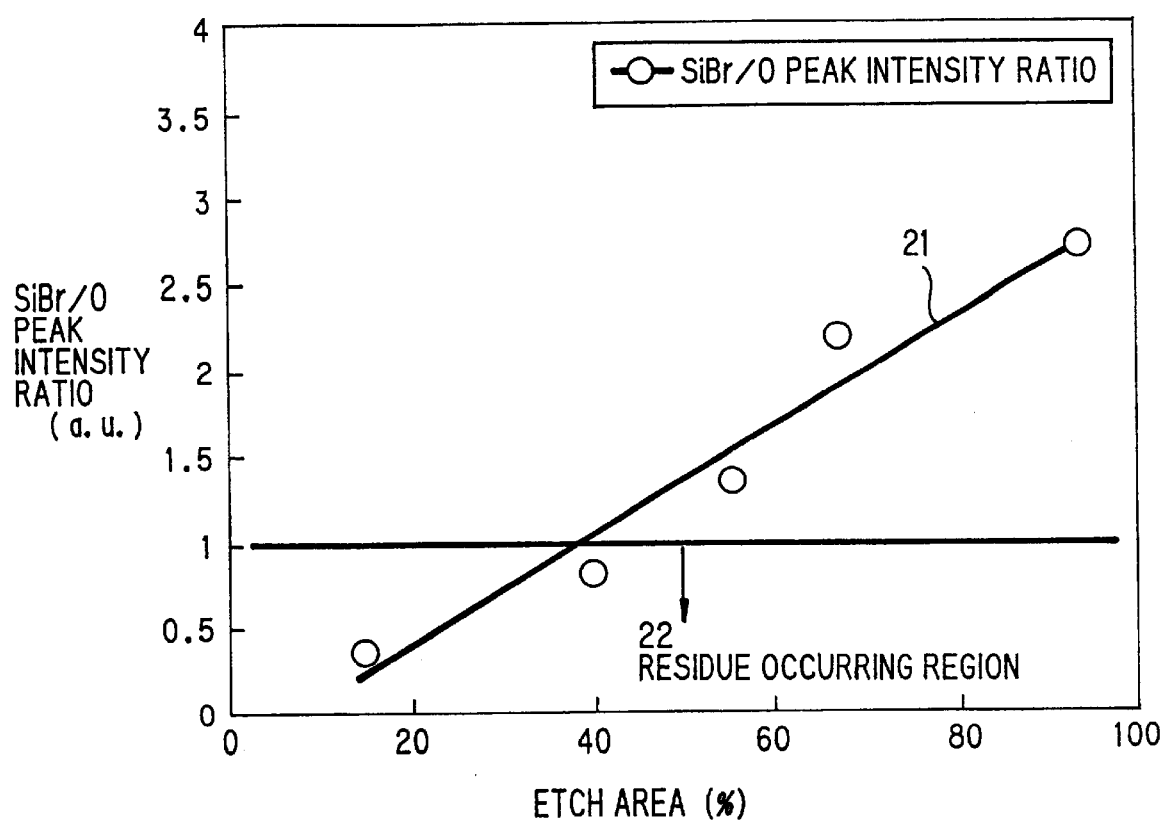
FIG. 4 is a graph obtained summarizing the experimental results data in searching the etch area dependency of SiBr/O peak intensity ratio.

From this analysis result of emission spectrum, with a decrease in etch area, the peak intensity of SiBr (emission wavelength 503 nm) as the etch product decreases and the peak intensity of oxygen O (emission wavelength 617 nm) increases. As a result, as shown in FIG. 4, the SiBr/O peak intensity decreases (meanwhile, FIG. 4 is a graph obtained summarizing the experimental results data in searching the etch area dependency of SiBr/O peak intensity ratio).

Further, when the SiBr/O peak intensity ratio is 1 or less, the etch residue or etch stop occurs.

Next, with samples with various etch areas, by changing the SiBr/O peak intensity ratio by varying the oxygen mixing ratio in etch gas, it is measured whether the residue exists or not (refer to a graph obtained summarizing the experimental results data in searching the oxygen mixing ratio dependency of SiBr/O peak intensity ratio in FIG. 5).

In this case, in the samples with any etch areas, the residue occurs when the SiBr/O peak intensity ratio is one or less. Namely, it is proved that whether the residue exists or not is determined by the SiBr/O peak intensity ratio.

Figure 6A:
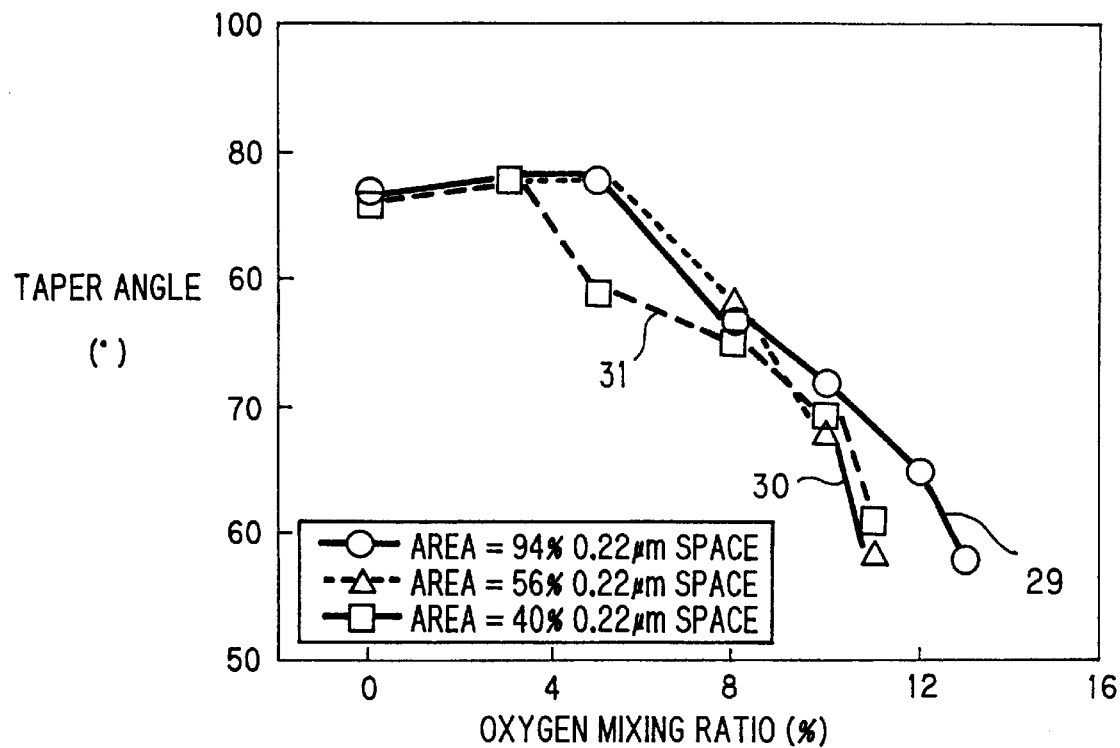
FIGS. 6A and 6B are graphs obtained summarizing the experimental results data in searching the oxygen mixing ratio dependency of taper angle.
Figure 6B:
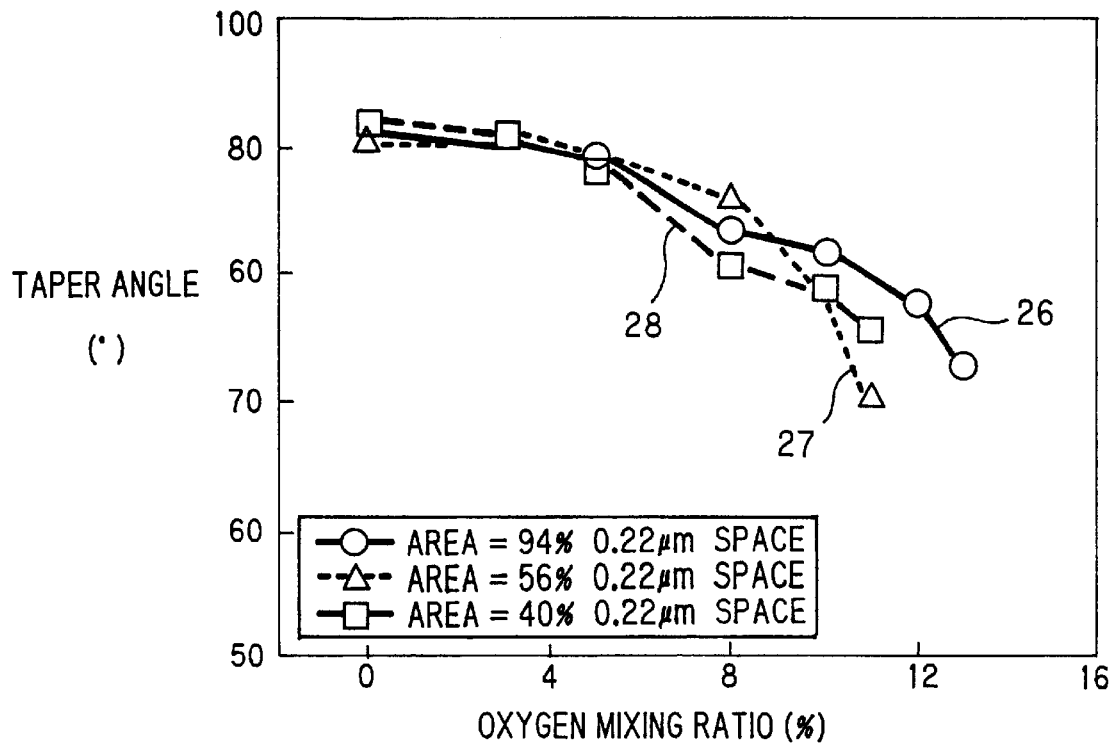

On the other hand, as shown in FIGS. 6A and 6B, the taper angle depends on only the oxygen mixing ratio and little depends on the etch area (meanwhile, FIGS. 6A and 6B are graphs obtained summarizing the experimental results data in searching the oxygen mixing ratio dependency of taper angle).

It is proved that the deposition amount of the sidewall of trench, which is a factor to form the taper, is determined by the amount of oxygen and the oxygen mixing ratio needs to be 8% or more to obtain a shape with a taper angle of about 80° at a separation width of 0.22 μm.

As the cause of residue occurred when the etch area decreases, it is supposed that a micro mask composed of silicon oxide (SiOx) is likely to form, due to the increase in the emission peak intensity of oxygen. Other than this, it is supposed that the etch product $SiBr_x$ affects the removal of the micro mask (oxide), due to the decrease in the SiBr peak intensity. From these reasons, the effect of $SiBr_x$ to $SiO_2$ etch rate is searched.

Figure 7:
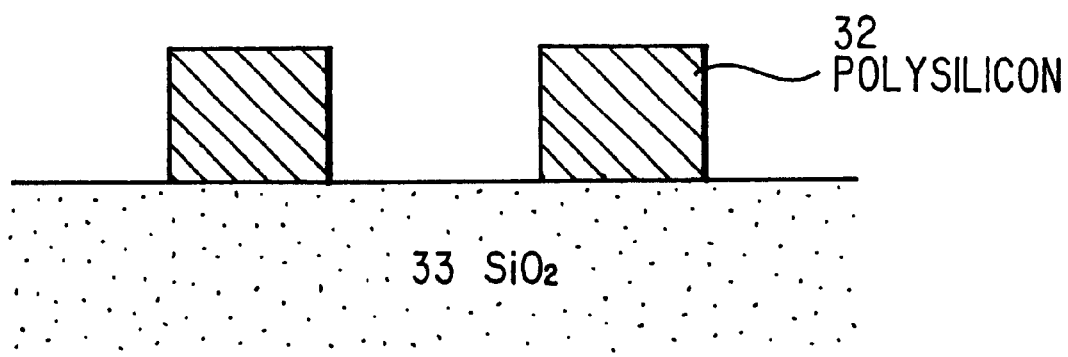
FIG. 7 is a cross sectional view showing an etched sample used for the experiment to measure the effect of etch product $SiBr_x$ to $SiO_2$-etched amount.

Fig. 7 shows an etched sample used for the experiment to measure the effect of etch product $SiBr_x$ to $SiO_2$-etched amount.

Using the sample shown in FIG. 7, the etching time dependency of $SiO_2$-etched amount is measured. By using this sample, the etch product $SiBr_x$ is supplied while polysilicon exists. However, after completing the polysilicon etching, the supply of $SiBr_x$ stops. Thus, the effect of $SiBr_x$ to $SiO_2$-etched amount can be found.

Figure 8:
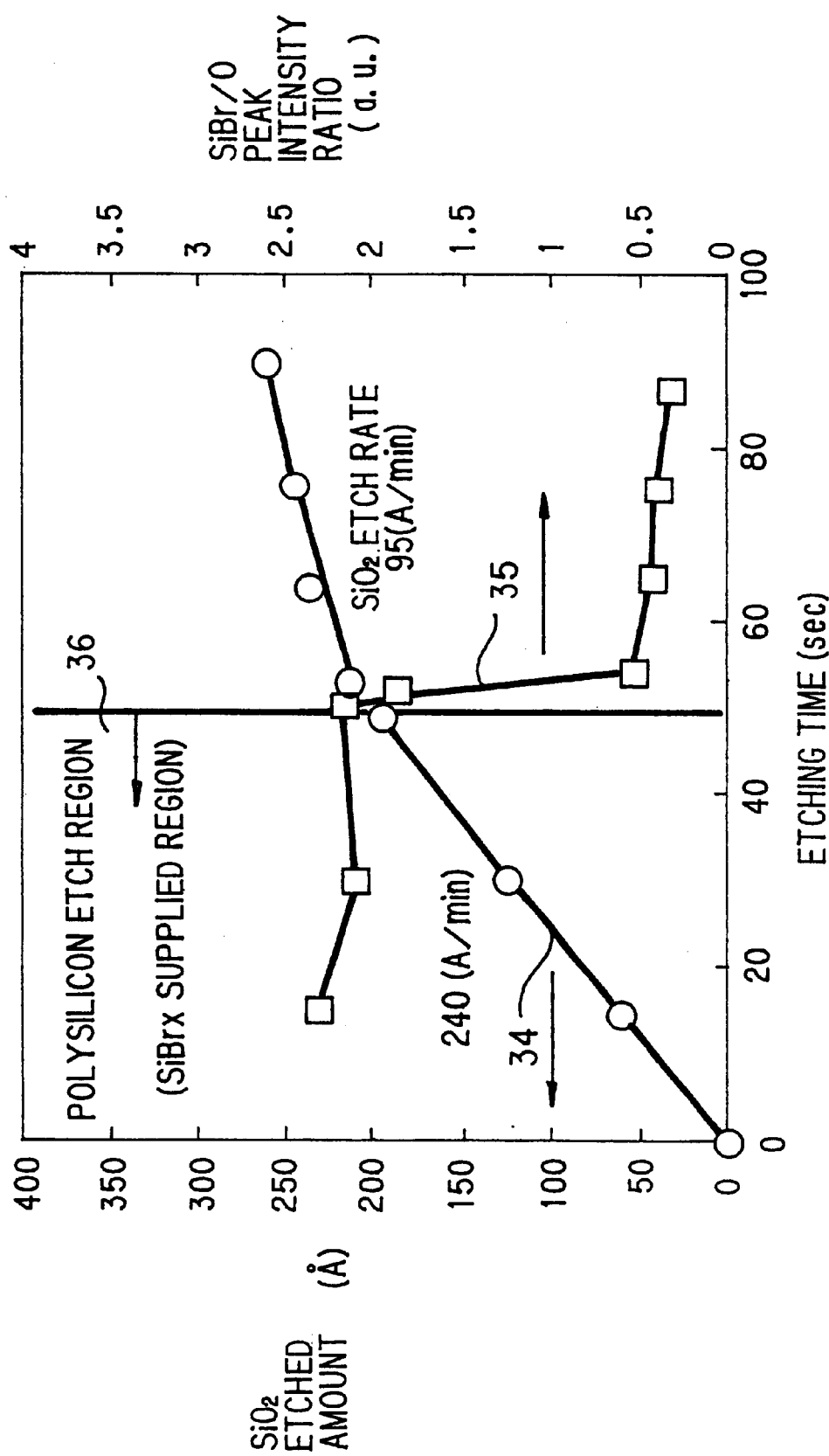
FIG. 8 is a graph obtained summarizing the experimental results data in searching the etching time dependency of $SiO_2$-etched amount and SiBr/O peak intensity ratio.

As shown in FIG. 8, the slopes of graphs are different between during the polysilicon etching and after the polysilicon etching. When $SiBr_x$ exists in the chamber, the etch rate of $SiO_2$ becomes higher. From this, it can be judged that $SiBr_x$ has the ability to remove the oxide (meanwhile, FIG. 8 is a graph obtained summarizing the experimental results data in searching the etching time dependency of $SiO_2$-etched amount and SiBr/O peak intensity ratio).

From the above matters, under the condition that the amount of oxygen added is constant, the amount of SiBr to be discharged in the plasma decreases with the decrease in etch area. In this case, the gaseous atmosphere in plasma is classified into oxidizing atmosphere or reducing atmosphere, according to the ratio of SiBr and O. In a sample that a small amount of SiBr is discharged, i.e., a sample with a small etch area, the micro mask is formed due to the oxidizing atmosphere, thereby causing the residue. On the other hand, in a sample with a large etch area, it is supposed that the reducing atmosphere occurs due to the existence of much SiBr and the micro mask is therefore not formed, thereby generating no residue. Namely, by monitoring the SiBr/O peak intensity ratio, the oxidizing atmosphere and reducing atmosphere can be identified. In particular, when the SiBr/O peak intensity ratio is made to be 1 or more, the reducing atmosphere can be obtained, thereby enabling the etching not to generate any residue.

Second Embodiment

Next, an etching method in the second embodiment according to the present invention will be explained.

An etching system used in the etching method of the second embodiment has the same composition as the etching system used in the etching method of the first embodiment.

The steps of the etching method in the second embodiment according to the present invention will be explained below, on the basis of the above-mentioned matters.

As described earlier, the taper angle depends on only the oxygen mixing ratio in etch gas, and the oxygen mixing ratio needs to be 8% or more to obtain a shape with a taper angle of about 80° at a separation width of 0.22 $\mu$m. Under this condition, in case of a small etch area, the SiBr/O peak intensity ratio becomes 1 or less, i.e., oxidizing atmosphere, therefore generating the residue. In case of a small etch area, the SiBr/O peak intensity ratio needs to be increased to more than 1.

So, the second embodiment of the present invention is applied to the case of a small etch area, adding silicon-halide-system gas, such as $SiF_4$, $SiCl_4$ and $SiBr_4$, to etch gas $HBr/O_2$ (more than 8% mixed) to make the SiBr/O peak intensity ratio 1 or more.

Figure 9:
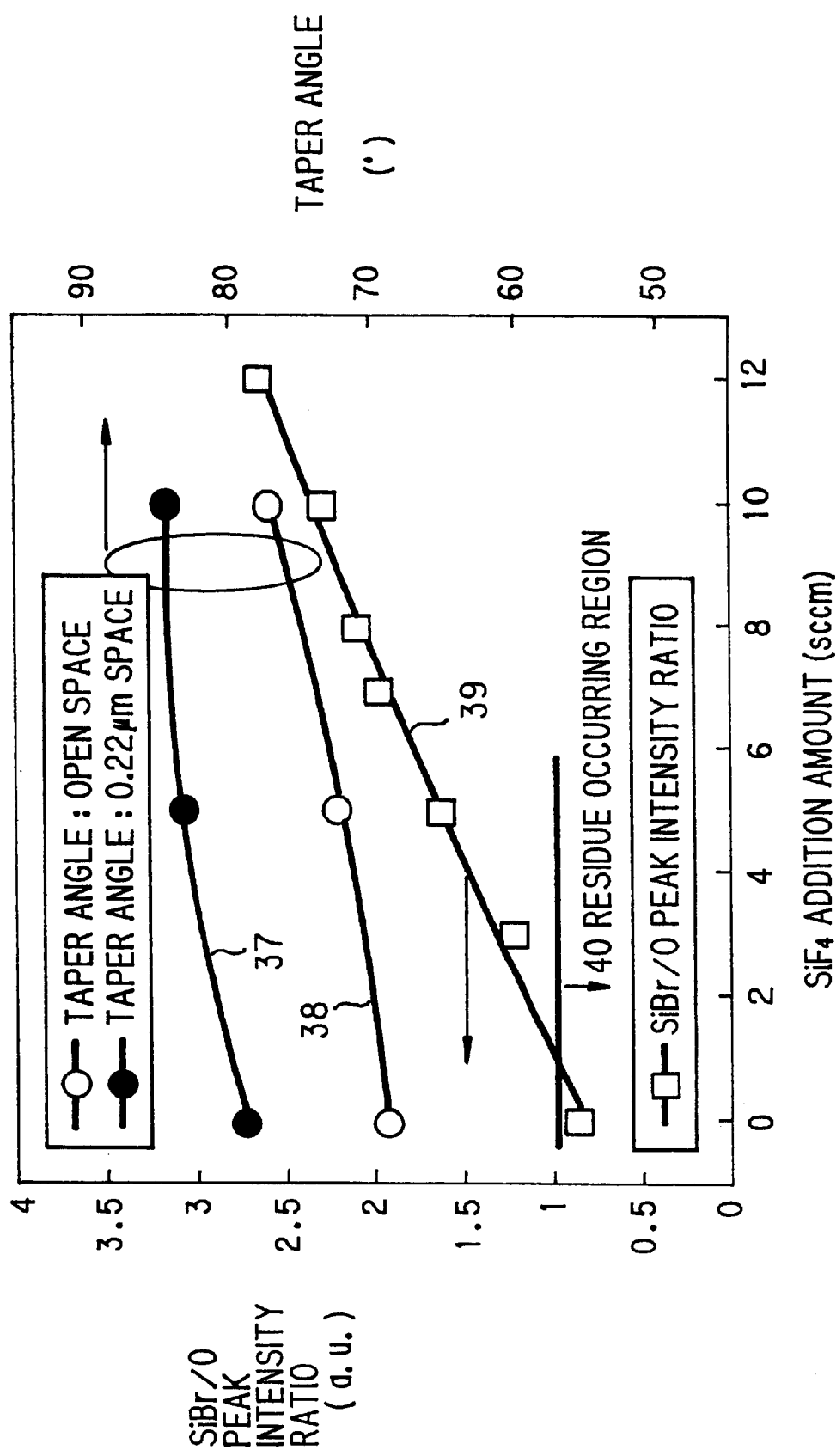
FIG. 9 is a graph obtained summarizing the experimental results data in searching the $SiF_4$-gas addition amount dependency of SiBr/O peak intensity ratio and taper angle.

FIG. 9 is a graph obtained summarizing the experimental results data in searching the $SiF_4$-gas addition amount dependency of SiBr/O peak intensity ratio and taper angle.

Figure 10:
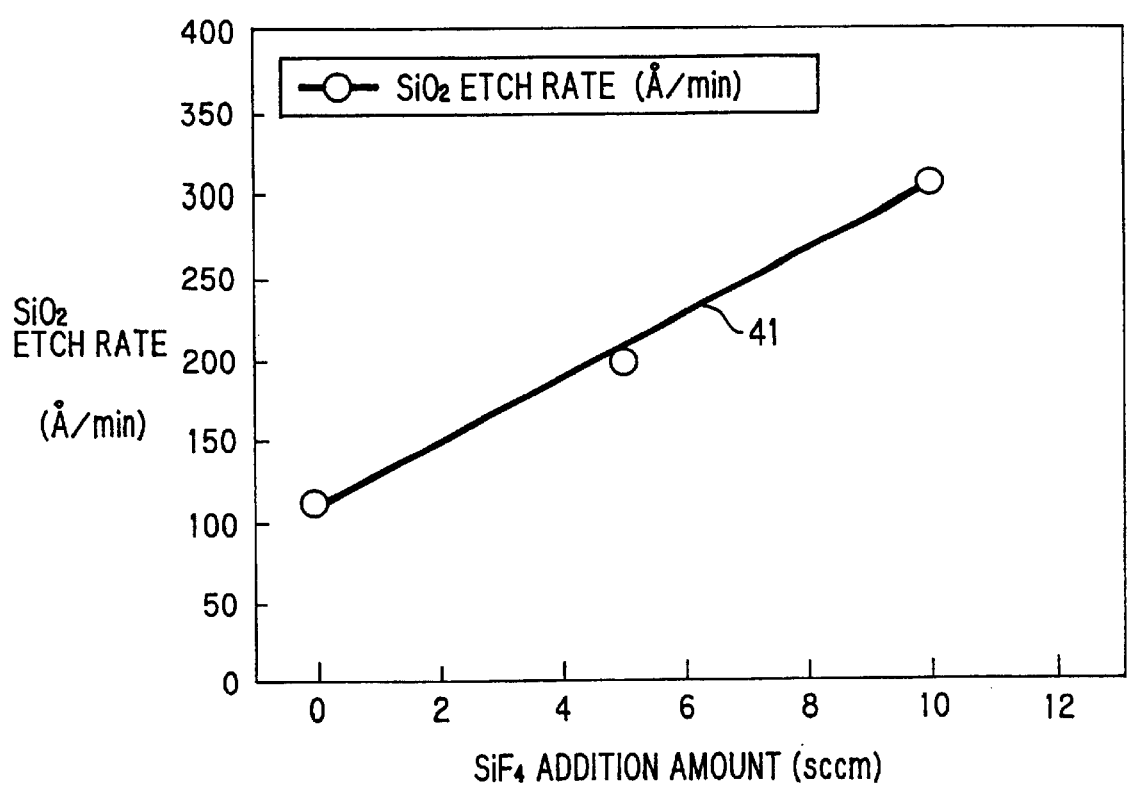
FIG. 10 is a graph obtained summarizing the experimental results data in searching the $SiF_4$-gas addition amount dependency of $SiO_2$ etch rate.

The SiBr/O peak intensity ratio increases with an increase of $SiF_4$-gas addition amount, and, when it becomes 1 or more, the residue disappears. Also, the taper angle gradually increases. Here, as shown in FIG. 10, when $SiF_4$ gas is added, the etch rate of $SiO_2$ increases. Therefore, it is thought that the taper angle decreases because deposition composed of $SiO_x$ deposited on the sidewall of trench decreases (meanwhile, FIG. 10 is a graph obtained summarizing the experimental results data in searching the $SiF_4$-gas addition amount dependency of $SiO_2$ etch rate).

Namely, $SiF_4$ gas has a reducing property to pull out oxygen. Thus, in case of the small etch area, adding $SiF_4$ gas to etch gas $HBr/O_2$ (more than 8% mixed) to increase the SiBr/O peak intensity ratio and control the taper angle is an effective means. Meanwhile, though only data when adding $SiF_4$ gas are shown herein, the addition of $SiCl_4$, $SiBr_4$ etc. can also bring the same effect.

Third Embodiment

Next, an etching method in the third embodiment according to the present invention will be explained.

FIG. 11 shows the composition of an etching system used in the etching method of the third embodiment according to the present invention.

The etching system used in the etching method of the third embodiment has the same composition as the etching system used in the etching method of the first embodiment according to the present invention, except a wafer 66 put on the lower electrode 5.

The steps of the etching method in the third embodiment will be explained below, on the basis of the above-mentioned matters.

In the second embodiment mentioned above, in case of the small etch area, silicon-halide-system gas, such as $SiF_4$, as etch gas is added to etch gas $HBr/O_2$ (more than 8% mixed). However, in this embodiment, as shown in FIG. 11, a member 42 of silicon with a larger area than the area of the wafer 66 is disposed in the chamber 1, planning the SiBr/O peak intensity ratio not to depend on etch area. In particular, by disposing the doughnut-like Si member 42 on an edge ring disposed surrounding the wafer 66 and on the lower electrode 5, a process not depending on etch area is enabled. Namely, by disposing the doughnut-like Si member 42 on the lower electrode 5, the Si member 42 becomes easy to etch, and therefore SiBr becomes easy to feed.

In the third embodiment, silicon-halid-system gas, such as $SiF_4$, as etch gas may be added to etch gas $HBr/O_2$ (more than 8% mixed), like the second embodiment mentioned above.

Fourth Embodiment

Next, an etching method in the fourth embodiment according to the present invention will be explained.

The etching system used in the etching method of this embodiment has the same composition as the etching system (refer to FIG. 1) used in the etching method of the first embodiment according to the present invention.

The steps of the etching method in the fourth embodiment will be explained below, on the basis of the above-mentioned matters. Meanwhile, though the Si member is disposed outside the wafer in the third embodiment, in the fourth embodiment, by using polysilicon as etch mask, an etching process that the SiBr/O peak intensity ratio does not depend on etch area is enabled.

Figure 12A:
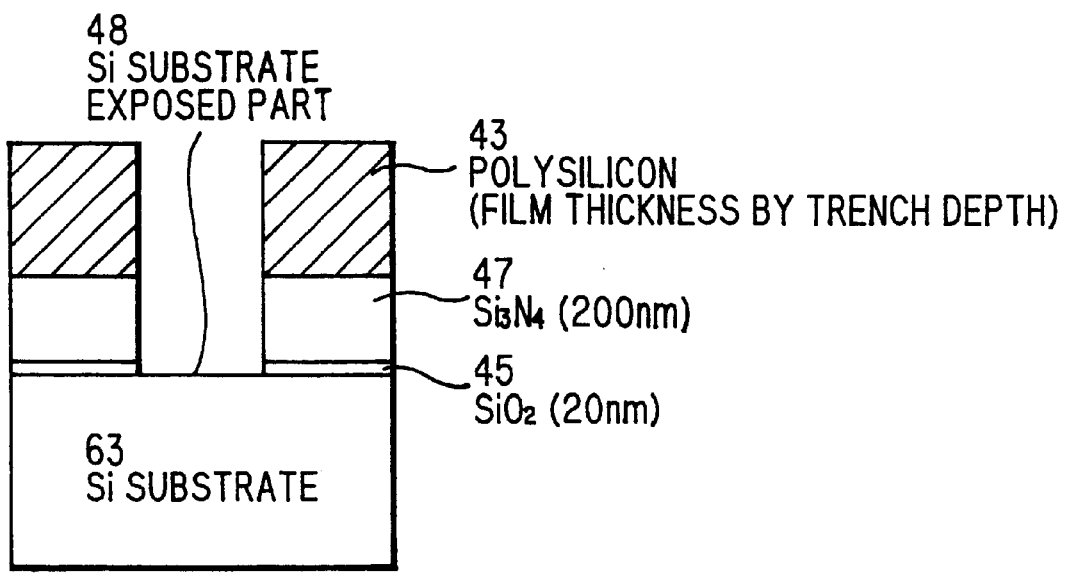
FIGS. 12A and 12B are cross sectional views showing an etched sample to be sequentially processed by an etching method in a fourth preferred embodiment according to the present invention.
Figure 12B:
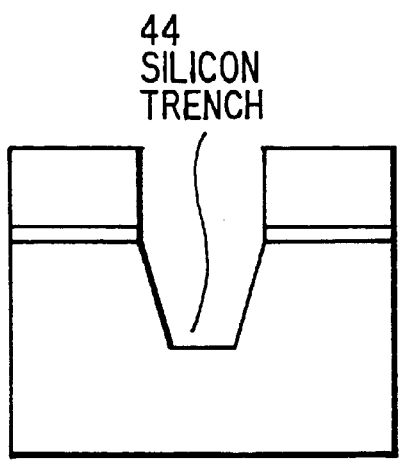

FIGS. 12A and 12B are cross sectional views showing an etched sample to be sequentially processed by the etching method in the fourth embodiment according to the present invention.

Referring to FIG. 1 and FIGS. 12A and 12B, the steps of the etching method in the fourth embodiment according to the present invention will be explained below.

In the etching method of the fourth embodiment, as shown in FIG. 12A, an oxide film ($SiO_2$) 45 of about 20 nm thick is first formed on a single-crystal silicon substrate 63, and then a silicon nitride film ($Si_3N_4$) 47 of about 200 nm thick is formed thereon, and further a polysilicon film 43 with a film thickness corresponding to a desired trench depth to be etched is formed thereon. Then, patterning is conducted by the photolithography process and the dry etching process of polysilicon film 43, silicon nitride film 47 and oxide film 45, and part where a silicon trench will be formed is exposed.

Thereafter, at part (refer to FIG. 12B) where a silicon trench 44 will be formed, the photoresist film is removed, the silicon nitride film 47 as the mask when conducting the trench etching is removed, and the oxide film ($SiO_2$) 45 is also removed, thereby exposing a Si substrate exposed part 48.

In the step in FIG. 12A, by using the etching system shown in FIG. 1, the silicon trench etching is conducted using the same control method as that disclosed in the first embodiment. Then, as shown in FIG. 12B, the silicon trench 44 is formed.

In the fourth embodiment, the etching process not depending on the etch area of sample is enabled.

Also, as a pre-treatment for etching, the polysilicon film 43 with a film thickness corresponding to a desired trench depth is formed in advance. Therefore, there is the merit that the end point of trench etching can be easily detected.

Advantages of the Invention:

As described above, by the etching method according to the present invention, in gas plasma etching, emission inside the chamber is spectrum-analyzed and the results are continuously fed back to the etching conditions etc. Thereby, the etching does not generate any etch residue or etch stop.

Also, there occurs the effect that the taper angle of a trench to be formed by etching can be constant regardless of the etch area.

Also, the above effects can be obtained by using means to cope with a variation in a specification required to etching, despite the variation in a specification, such as the ratio of etch area to an etched sample.

Further, they can be realized succeeding the conventional plasma etching technique, i.e., by means within the range of conventional facilities. Also, they can be realized by introducing additionally a larger-scale automatic control unit as the case may be, i.e., to have an expandability to be prepared to the prospects for the future.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method of gas plasma etching a semiconductor substrate, comprising the steps of:
    forming a trench in a semiconductor substrate by gas plasma etching with a gas that generates two etch products during the gas plasma etching;
    detecting peak intensities of emission spectrums of the two etch products;
    determining a ratio of the detected peak intensities; and
    controlling the gas plasma etching based on the determined ratio of peak intensities,
    said gas plasma etching being controlled to keep the peak intensity ratio between the emission spectra to be 1 to 2.

2. An etching method, according to claim 1, wherein:
    conditions for the gas plasm etching are that the gas is $HBr/O_2$ with a flow rate of 90/10 sccm, a pressure of 5 mTorr, and wherein a source power is 600 W and a bias power is 150 W.

3. An etching method, according to claim 2, wherein:
    at least one of $SiF_4$, $SiCl_4$ and $SiBr_4$ is added to the $HBr/O_2$ gas.

4. An etching method, according to claim 2, wherein:
    a member of silicon with a larger area than the upper area of said semiconductor substrate is disposed surrounding said semiconductor substrate.

5. An etching method, according to claim 2, wherein:
    said forming step comprises the steps of:
        forming an oxide film, which includes at least $SiO_2$, 20 nm thick on the surface of said semiconductor substrate;
        forming a nitride film, which includes at least $Si_3N_4$, 200 nm thick on the oxide film; and
        removing said oxide film and said nitride film where said trench is to be formed on said semiconductor substrate to give an exposed part.

6. An etching method, according to claim 2, wherein:
    said forming step comprises the steps of:
        forming an oxide film, which includes at least $SiO_2$, 20 nm thick on the surface of said semiconductor substrate;
        forming a nitride film, which includes at least $Si_3N_4$, 200 nm thick on the oxide film;
        forming a polysilicon film as an etch mask on the nitride film; and
        removing said oxide film, said nitride film and said polysilicon film where said trench is to be formed on said semiconductor substrate to give an exposed part.

7. An etching method, according to claim 1, wherein:
    a member of silicon with a larger area than the upper area of said semiconductor substrate is disposed surrounding said semiconductor substrate.

8. An etching method, according to claim 7, wherein:
    said forming step comprises the steps of:
        forming an oxide film, which includes at least $SiO_2$, 20 nm thick on the surface of said semiconductor substrate;
        forming a nitride film, which includes at least $Si_3N_4$, 200 nm thick on the oxide film; and
        removing said oxide film and said nitride film where said trench is to be formed on said semiconductor substrate to give an exposed part.

9. An etching method, according to claim 7, wherein:
    said forming step comprises the steps of:
        forming an oxide film, which includes at least $SiO_2$, 20 nm thick on the surface of said semiconductor substrate;
        forming a nitride film, which includes at least $Si_3N_4$, 200 nm thick on the oxide film;
        forming a polysilicon film as an etch mask on the nitride film; and
        removing said oxide film, said nitride film and said polysilicon film where said trench is to be formed on said semiconductor substrate to give an exposed part.

10. An etching method, according to claim 1, wherein:
    a member of silicon with a larger area than the upper area of said semiconductor substrate is disposed surrounding said semiconductor substrate.

11. An etching method, according to claim 1, wherein:
    said forming step comprises the steps of:
        forming an oxide film, which includes at least $SiO_2$, 20 nm thick on the surface of said semiconductor substrate;
        forming a nitride film, which includes at least $Si_3N_4$, 200 nm thick on the oxide film; and
        removing said oxide film and said nitride film where said trench is to be formed on said semiconductor substrate to give an exposed part.

12. An etching method, according to claim 1, wherein:
    said forming step comprises the steps of:
        forming an oxide film, which includes at least $SiO_2$, 20 nm thick on the surface of said semiconductor substrate;
        forming a nitride film, which includes at least $Si_3N_4$, 200 nm thick on the oxide film;
        forming a polysilicon film as an etch mask on the nitride film; and removing said oxide film, said nitride film and said polysilicon film where said trench is to be formed on said semiconductor substrate to give an exposed part.

13. An etching method, according to claim 12, wherein: said polysilicon film is formed to have a thickness corresponding to that of said trench to be formed in said plasma etching.

14. A method of gas plasma etching a semiconductor substrate, comprising the steps of:
forming a trench in a semiconductor substrate by gas plasma etching with a gas that generates two etch products during the gas plasma etching;
detecting peak intensities of emission spectrums of the two etch products;
determining a ratio of the detected peak intensities;
controlling the gas plasma etching based on the determined ratio of peak intensities;
forming an oxide film, which includes at least $SiO_2$, 20 nm thick on the surface of said semiconductor substrate;
forming a nitride film, which includes at least $Si_3N_4$, 200 nm thick on the oxide film;
forming a polysilicon film as an etch mask on the nitride film; and
removing said oxide film, said nitride film and said polysilicon film where said trench is to be formed on said semiconductor substrate to give an exposed part, said polysilicon film is formed to have a thickness corresponding to that of said trench to be formed in said plasma etching.

15. An etching method, according to claim 14, wherein: at least one of $SiF_4$, $SiCl_4$ and $SiBr_4$ is added to the $HBr/O_2$ system gas.

16. An etching method, according to claim 15, wherein: a member of silicon with a larger area than the upper area of said semiconductor substrate is disposed surrounding said semiconductor substrate.

17. An etching method, according to claim 15, wherein: said forming step comprises the steps of:
forming an oxide film, which includes at least $SiO_2$, 20 nm thick on the surface of said semiconductor substrate;
forming a nitride film, which includes at least $Si_3N_4$, 200 nm thick on the oxide film; and
removing said oxide film and said nitride film where said trench is to be formed on said semiconductor substrate to give an exposed part.

18. An etching method, according to claim 15, wherein: said forming step comprises the steps of:
forming an oxide film, which includes at least $SiO_2$, 20 nm thick on the surface of said semiconductor substrate;
forming a nitride film, which includes at least $Si_3N_4$, 200 nm thick on the oxide film;
forming a polysilicon film as an etch mask on the nitride film; and
removing said oxide film, said nitride film and said polysilicon film where said trench is to be formed on said semiconductor substrate to give an exposed part.

19. An etching method, according to claim 14, wherein: a member of silicon with a larger area than the upper area of said semiconductor substrate is disposed surrounding said semiconductor substrate.

20. A method of gas plasma etching a semiconductor substrate, comprising the steps of:
forming a trench in a semiconductor substrate by gas plasma etching with a gas that generates two etch products during the gas plasma etching;
surrounding the semiconductor substrate with a silicon member whose area is larger than an upper area of the semiconductor substrate;
detecting peak intensities of emission spectrums of the two etch products;
determining a ratio of the detected peak intensities; and
controlling the gas plasma etching based on the determined ratio of peak intensities.

21. An etching method, according to claim 20, wherein: said semiconductor substrate is of mono-crystal silicon.

22. An etching method, according to claim 20, wherein: said etching step is conducted by using a inductively-coupled plasma etching system.

23. An etching method, according to claim 20, wherein: said detecting step is conducted by using an emission spectrum analyzer.

24. An etching method, according to claim 20, wherein: said gas plasma etching is conducted using $HBr/O_2$ system gas.

25. An etching method, according to claim 24, wherein the two etch products are SiBr and oxygen, and said detecting and determining steps include the step of monitoring the peak intensity ratio between the emission spectra of the SiBr at a first wavelength and the oxygen at a second wavelength.

26. An etching method, according to claim 25, wherein: the first wavelength is 504 nm and the second wavelength is 617 nm.

27. An etching method, according to claim 26, wherein: at least one of $SiF_4$, $SiCl_4$ and $SiBr_4$ is added to the $HBr/O_2$ system gas.

28. An etching method, according to claim 26, wherein: said forming step comprises the steps of:
forming an oxide film, which includes at least $SiO_2$, 20 nm thick on the surface of said semiconductor substrate;
forming a nitride film, which includes at least $Si_3N_4$, 200 nm thick on the oxide film; and
removing said oxide film and said nitride film where said trench is to be formed on said semiconductor substrate to give an exposed part.

29. An etching method, according to claim 26, wherein: said forming step comprises the steps of:
forming an oxide film, which includes at least $SiO_2$, 20 nm thick on the surface of said semiconductor substrate;
forming a nitride film, which includes at least $Si_3N_4$, 200 nm thick on the oxide film;
forming a polysilicon film as an etch mask on the nitride film; and
removing said oxide film, said nitride film and said polysilicon film where said trench is to be formed on said semiconductor substrate to give an exposed part.

30. An etching method, according to claim 24, wherein: said forming step comprises the steps of:
forming an oxide film, which includes at least $SiO_2$, 20 nm thick on the surface of said semiconductor substrate;
forming a nitride film, which includes at least $Si_3N_4$, 200 nm thick on the oxide film; and
removing said oxide film and said nitride film where said trench is to be formed on said semiconductor substrate to give an exposed part.

31. An etching method, according to claim 24, wherein:
said forming step comprises the steps of:
    forming an oxide film, which includes at least $SiO_2$, 20 nm thick on the surface of said semiconductor substrate;
    forming a nitride film, which includes at least $Si_3N_4$, 200 nm thick on the oxide film;
    forming a polysilicon film as an etch mask on the nitride film; and
    removing said oxide film, said nitride film and said polysilicon film where said trench is to be formed on said semiconductor substrate to give an exposed part.

32. A method of gas plasma etching a semiconductor substrate, comprising the steps of:
    forming a trench in a semiconductor substrate by gas plasma etching with a system gas that generates etch products during the gas plasma etching;
    surrounding the semiconductor substrate with a silicon member whose area is larger than an upper area of the semiconductor substrate;
    detecting and analyzing emission spectrums of the etch products;
    monitoring the analyzed emission spectrums;
    controlling the gas plasma etching based on the monitored emission spectrum analysis.

33. An etching method, according to claim 32, wherein: the system gas is $HBr/O_2$ and at least one of $SiSiF_4$, $SiCl_4$ and $SiBr_4$ is added to the $HBr/O_2$ system gas.

34. An etching method, according to claim 32, wherein: said forming step comprises the steps of:
    forming an oxide film, which includes at least $SiO_2$, 20 nm thick on the surface of said semiconductor substrate;
    forming a nitride film, which includes at least $Si_3N_4$, 200 nm thick on the oxide film; and
    removing said oxide film and said nitride film where said trench is to be formed on said semiconductor substrate to give an exposed part.

35. An etching method, according to claim 32, wherein: said forming step comprises the steps of:
    forming an oxide film, which includes at least $SiO_2$, 20 nm thick on the surface of said semiconductor substrate;
    forming a nitride film, which includes at least $Si_3N_4$, 200 nm thick on the oxide film;
    forming a polysilicon film as an etch mask on the nitride film; and
    removing said oxide film, said nitride film and said polysilicon film where said trench is to be formed on said semiconductor substrate to give an exposed part.

36. The method of claim 32, wherein said detecting, monitoring, and controlling steps include the steps of detecting peak intensities of the emission spectrums of two of the etch products, determining a ratio of the detected peak intensities, and controlling the gas plasma etching based on the determined ratio of peak intensities.

37. The method of claim 36, wherein the controlling step controls the gas plasma etching so that the determined ratio of peak intensities is from 1 to 2.

38. A method of gas plasma etching a semiconductor substrate, comprising the steps of:
    forming a trench in a semiconductor substrate by gas plasma etching with a system gas that generates etch products during the gas plasma etching;
    detecting and analyzing emission spectrums of the etch products;
    monitoring the analyzed emission spectrums;
    controlling the gas plasma etching based on the monitored emission spectrum analysis;
    forming an oxide film, which includes at least $SiO_2$, 20 nm thick on the surface of said semiconductor substrate;
    forming a nitride film, which includes at least $Si_3N_4$, 200 nm thick on the oxide film;
    forming a polysilicon film as an etch mask on the nitride film; and
    removing said oxide film, said nitride film and said polysilicon film where said trench is to be formed on said semiconductor substrate to give an exposed part,
    said polysilicon film is formed to have a thickness corresponding to that of said trench to be formed in said plasma etching.

39. An etching method, according to claim 38, wherein:
a member of silicon with a larger area than the upper area of said semiconductor substrate is disposed surrounding said semiconductor substrate.

* * * * *